(12) United States Patent
Nakamura (10) Patent No.: US 6,242,962 B1
(45) Date of Patent: *Jun. 5, 2001

(54) LEVEL SHIFT CIRCUIT HAVING PLURAL LEVEL SHIFT STAGE STEPWISE CHANGING POTENTIAL RANGE WITHOUT APPLYING LARGE POTENTIAL DIFFERENCE TO COMPONENT TRANSISTORS

(75) Inventor: Hironori Nakamura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,611

(22) Filed: Sep. 15, 1998

(30) Foreign Application Priority Data

Sep. 16, 1997 (JP) .................................................... 9-250736

(51) Int. Cl.[7] ............................................... H03K 17/687

(52) U.S. Cl. .............................. 327/333; 326/62; 326/81

(58) Field of Search ................................... 327/333, 378, 327/215, 199; 326/62, 63, 80, 81, 82–88

(56) References Cited

U.S. PATENT DOCUMENTS

| | | | | |
|---|---|---|---|---|
| 4,039,862 | * | 8/1977 | Dingwall et al. | 327/333 |
| 5,493,245 | * | 2/1996 | Kao et al. | 327/333 |
| 5,585,740 | * | 12/1996 | Tipon | 326/26 |
| 5,742,196 | * | 4/1998 | Fronen et al. | 327/382 |
| 5,754,059 | * | 5/1998 | Tanghe et al. | 326/77 |
| 5,808,480 | * | 9/1998 | Morris | 326/81 |
| 5,900,752 | * | 5/1999 | Mar | 327/143 |
| 5,903,142 | * | 5/1999 | Mann | 323/313 |

* cited by examiner

*Primary Examiner*—Timothy P. Callahan
*Assistant Examiner*—An T. Luu
(74) *Attorney, Agent, or Firm*—McGinn & Gibb, PLLC (57) ABSTRACT

A level shift circuit has plural level shift stages connected in series between an input node and an output node for producing an output signal, and a first level shift stage, an intermediate level shift stage and a final level shift stage produce a first intermediate signal changed between a positive power level and a first negative level from an input signal changed between the positive power level and the ground level, a second intermediate signal changed between the ground level and the first negative level from the first intermediate signal and an output signal changed between the ground level and a second negative level twice large in absolute value than the first negative level, thereby preventing the component field effect transistors from the large potential difference between the positive power level and the second negative level.

5 Claims, 7 Drawing Sheets

LEVEL SHIFT CIRCUIT HAVING PLURAL LEVEL SHIFT STAGE STEPWISE CHANGING POTENTIAL RANGE WITHOUT APPLYING LARGE POTENTIAL DIFFERENCE TO COMPONENT TRANSISTORS

FIELD OF THE INVENTION

This invention relates to a level shift circuit and, more particularly, to a level shift circuit for stepwise changing a potential range without applying large potential difference to component field effect transistors.

DESCRIPTION OF THE RELATED ART

A flash write memory device is a kind of electrically erasable and programmable read only memory device, and requires not only a signal changed between a positive power voltage level Vcc and a ground level GND but also a signal changed between the ground level GND and a negative erase voltage −Vpp. The negative erase voltage −Vpp is lower than the ground voltage GND by value Vpp, and the value Vpp is greater than value Vcc. The positive power voltage Vcc is usually 5 volts, and the negative erase voltage −Vpp is −12 volts. For this reason, the flash write memory device requires a level shift circuit, which shifts the signal changed between the positive power voltage Vcc and the ground level GND to the signal changed between the ground level GND and the negative erase voltage −Vpp.

Figure 1:
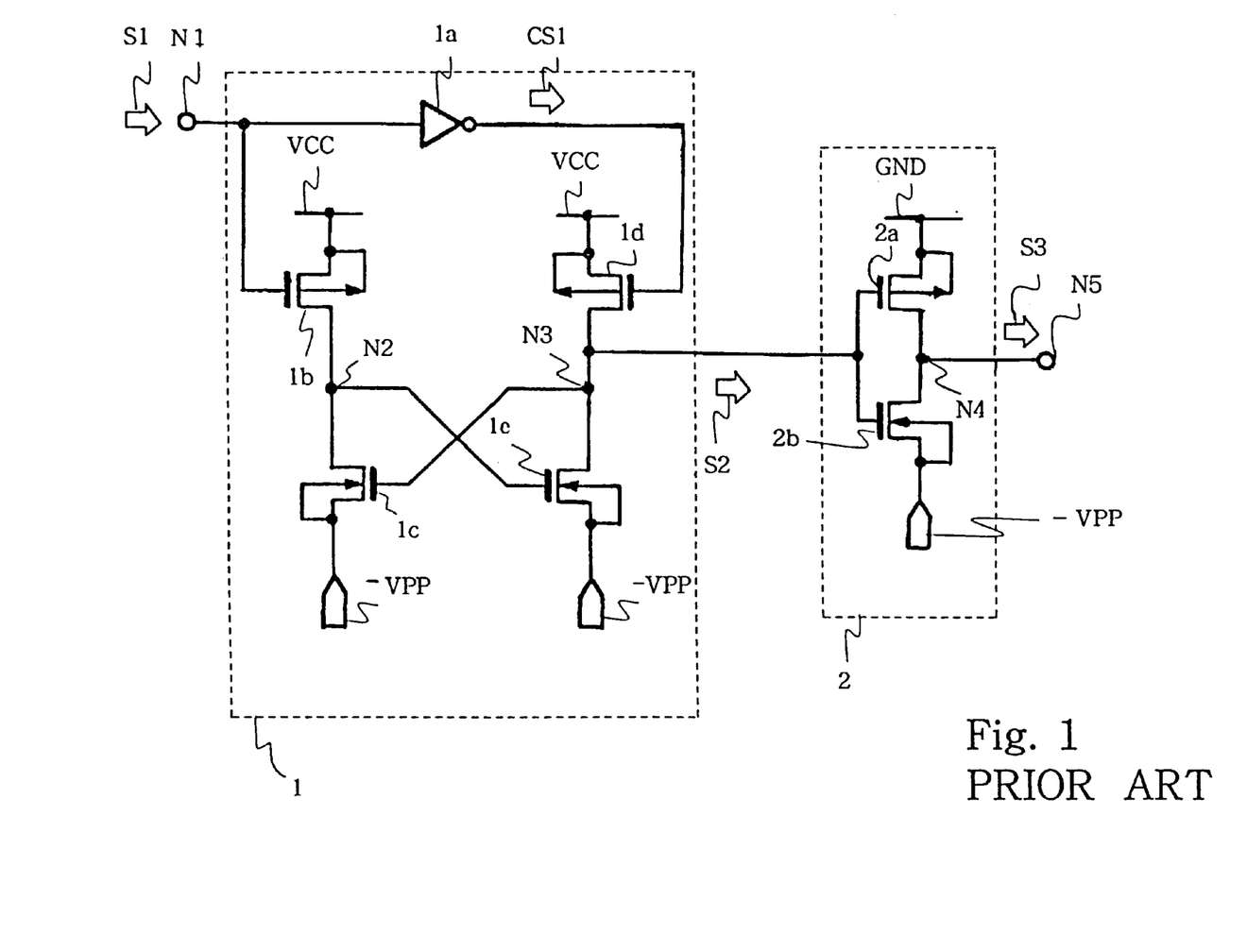
FIG. 1 is a circuit diagram showing the circuit configuration of the prior art level shift circuit.

FIG. 1 illustrates a typical example of the level shift circuit. The prior art level shift circuit comprises a first-stage level shifter 1 and a second stage level shifter 2. The first stage level shifter 1 changes a signal from the potential range between the positive power voltage Vcc and the ground level GND to a potential range between the positive power voltage Vcc and the negative voltage −Vpp, and the second stage level shifter 2 changes the signal from the potential range between the positive power voltage Vcc and the negative voltage −Vpp to another potential range between the ground level GND and the negative voltage −Vpp.

The first-stage level shifter 1 includes an inverter 1a connected to an input node N1, a series combination of a p-channel enhancement type field effect transistor 1b and an n-channel enhancement type field effect transistor 1c and another series combination of a p-channel enhancement type field effect transistor 1d and an n-channel enhancement type field effect transistor 1e arranged in parallel to the series combination. The series combination of the p-channel enhancement type field effect transistor 1b and the n-channel enhancement type field effect transistor 1c is connected between the positive power supply line VCC and the negative voltage line −VPP, and the input node N1 and the output node of the inverter 1a are connected to the gate electrode of the p-channel enhancement type field effect transistor 1b and the gate electrode of the other p-channel enhancement type field effect transistor 1d, respectively. The common drain nodes N2/N3 are connected to the gate electrode of the n-channel enhancement type field effect transistor 1e and the gate electrode of the n-channel enhancement type field effect transistor 1c, respectively. The common drain node N3 serves as an output node of the first-stage level shifter 1.

The first-stage level shifter 1 behaves as follows. An input signal S1 is changed between the positive power voltage level Vcc and the ground level GND. Assuming now that the input signal S1 is changed from the ground level GND to the positive power voltage Vcc, the inverter 1a inverts the potential level of the input signal S1 so as to produce the complementary input signal CS1 of the ground level GND. The input signal S1 and the complementary input signal CS1 are supplied to the gate electrode of the p-channel enhancement type field effect transistor 1b and the gate electrode of the p-channel enhancement type field effect transistor 1d. The input signal S1 causes the p-channel enhancement type field effect transistor 1b to turn off, and the complementary input signal CS1 causes the other p-channel enhancement type field effect transistor 1d to turn on. The common drain node N2 is isolated from the positive power voltage line VCC, and the other common drain node N3 is electrically connected to the positive power supply line VCC. Then, the positive power voltage Vcc at the common drain node N3 causes the n-channel enhancement type field effect transistor 1c to turn on, and the negative voltage −VPP is supplied to the other common drain node N2. The negative voltage −VPP at the common drain node N2 causes the other n-channel enhancement type field effect transistor 1e to turn off. Thus, the first-stage level shifter 1 changes the potential level at the common drain node N3 to the positive power voltage level Vcc, and supplies an intermediate signal S2 of the positive power voltage level Vcc to the second-stage level shifter 2.

On the other hand, when the input signal S1 is changed to the ground level GND, the inverter 1a changes the complementary input signal CS1 to the positive power voltage Vcc, and the input signal S1 and the complementary input signal CS1 are supplied to the gate electrode of the p-channel enhancement type field effect transistor 1b and the gate electrode of the p-channel enhancement type field effect transistor 1d, respectively. The p-channel enhancement type field effect transistor 1d turns off, and the other p-channel enhancement type field effect transistor 1b turns on. The positive power voltage Vcc is supplied to the common drain node N2, and the other common drain node N3 is isolated from the positive power supply line VCC. The positive power voltage Vcc at the common drain node N2 causes the n-channel enhancement type field effect transistor 1e to turn on, and the negative voltage −Vpp is supplied to the common drain node N3. The negative voltage −Vpp causes the other n-channel enhancement type field effect transistor 1c to turn off, and the intermediate signal S2 is fixed to the negative voltage −Vpp. Thus, the intermediate signal S2 is changed between the positive power voltage Vcc and the negative voltage −Vpp.

The second-stage level shifter 2 includes a series combination of p-channel enhancement type field effect transistor 2a and an n-channel enhancement type field effect transistor 2b connected between the ground line GND and the negative voltage line −VPP. The intermediate signal S2 is supplied to the gate electrode of the p-channel enhancement type field effect transistor 2a and the gate electrode of the n-channel enhancement type field effect transistor 2b, and an output signal S3 is supplied from the common drain node N4 to an output node N5.

When the intermediate signal S2 is in the positive power voltage Vcc, the n-channel enhancement type field effect transistor 2b turns on, and the p-channel enhancement type field effect transistor 2a turns off. As a result, the output signal S3 is changed to the negative voltage −Vpp. On the other hand, if the intermediate signal S2 is changed to the negative voltage −Vpp, the n-channel enhancement type field effect transistor 2b turns off, and the p-channel enhancement type field effect transistor 2a turns on. Then, the output signal S3 is changed to the ground level GND. Thus, the potential range between the positive power voltage Vcc and the ground level GND is changed through the potential range between the positive power voltage Vcc and the negative voltage −Vpp to the potential range between the ground level GND and the negative voltage −Vpp.

The manufacturer has increased the memory capacity of the flash write memory device, and still makes research and development efforts on increase of the memory capacity. The component field effect transistors are scaled down, and the p-channel enhancement type field effect transistors 1b/1d/2a and the n-channel enhancement type field effect transistors 1c/1d/2b are miniaturized. The component field effect transistors 1b/1d/2a and 1c/1d/2b are further scaled down, and the gate insulating layers are getting thinner and thinner. In this situation, the manufacturer encounters a problem in the prior art level shifter in that the prior art level shift circuit needs high breakdown voltage transistors for the n-channel enhancement type field effect transistors 1c/1e. As described hereinbefore, when the intermediate signal S2 is changed to the positive power voltage Vcc, the n-channel enhancement type field effect transistor 1c turns on, and the negative voltage −Vpp is supplied from the common drain node N2 to the gate electrode of the n-channel enhancement type field effect transistor 1e. For this reason, the difference between the positive power voltage Vcc and the negative voltage −Vpp is applied between the gate electrode of the n-channel enhancement type field effect transistor 1e and the drain node thereof. The difference is 17 volts, i.e., Vcc−(−Vpp). Similarly, when the intermediate signal S2 is changed to the negative voltage −VPP, the large potential difference is applied between the drain node of the n-channel enhancement type field effect transistor 1c and the gate electrode thereof. Thus, the large potential difference is applied between the drain node and the gate electrode, and high breakdown transistors are required for the n-channel enhancement type field effect transistors 1c/1e.

SUMMARY OF THE INVENTION

It is therefore an important object of the present invention to provide a level shift circuit, which does not require any high breakdown transistor.

Figure 2:
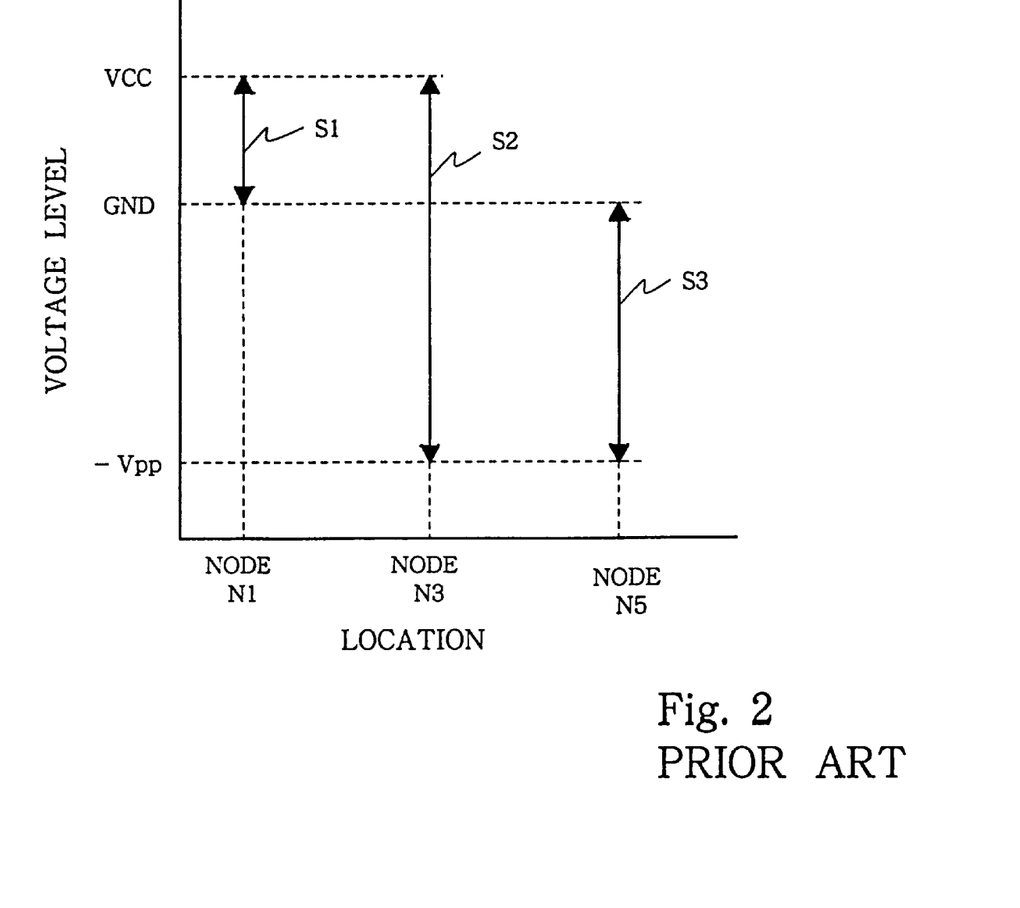
FIG. 2 is a view showing the variation of potential range from the input signal to the output signal.

The present inventor contemplated the problem inherent in the prior art level shift circuit, and noticed that the prior art level shift circuit widened the voltage range from the input signal S1 to the intermediate signal S2 and, thereafter, shrank the voltage range from the intermediate signal S2 to the output signal S3 (see FIG. 2). When the signal was expanded to the widest range, the large potential difference was applied between the gate electrode and the drain node of the component field effect transistor 1c/1e. The present inventor thought of stepwise varying the potential range from an input range to an output range.

To accomplish the object, the present invention proposes to stepwise change the one of the upper limit and the lower limit of a potential range.

In accordance with one aspect of the present invention, there is provided a level shift circuit comprising a plurality of level shift stages connected in series between an input node and an output node for producing an output signal changed between a first limit voltage and a second limit voltage at the output node from an input signal changed between a third limit voltage to a fourth limit voltage closer to said first limit voltage than said third limit voltage at the input node, and each of the plurality of level shift stages produces one of the output signal and an intermediate signal changed in a voltage range defined by a combination of two different voltages between the second limit voltage and the third limit voltage except for the combination of the second limit voltage and the third limit voltage.

BRIEF DESCRIPTION OF THE DRAWINGS

The features and advantages of the level shift circuit will be more clearly understood from the following description taken in conjunction with the accompanying drawings in which.

DESCRIPTION OF THE PREFERRED EMBODIMENTS

First Embodiment

Figure 3:
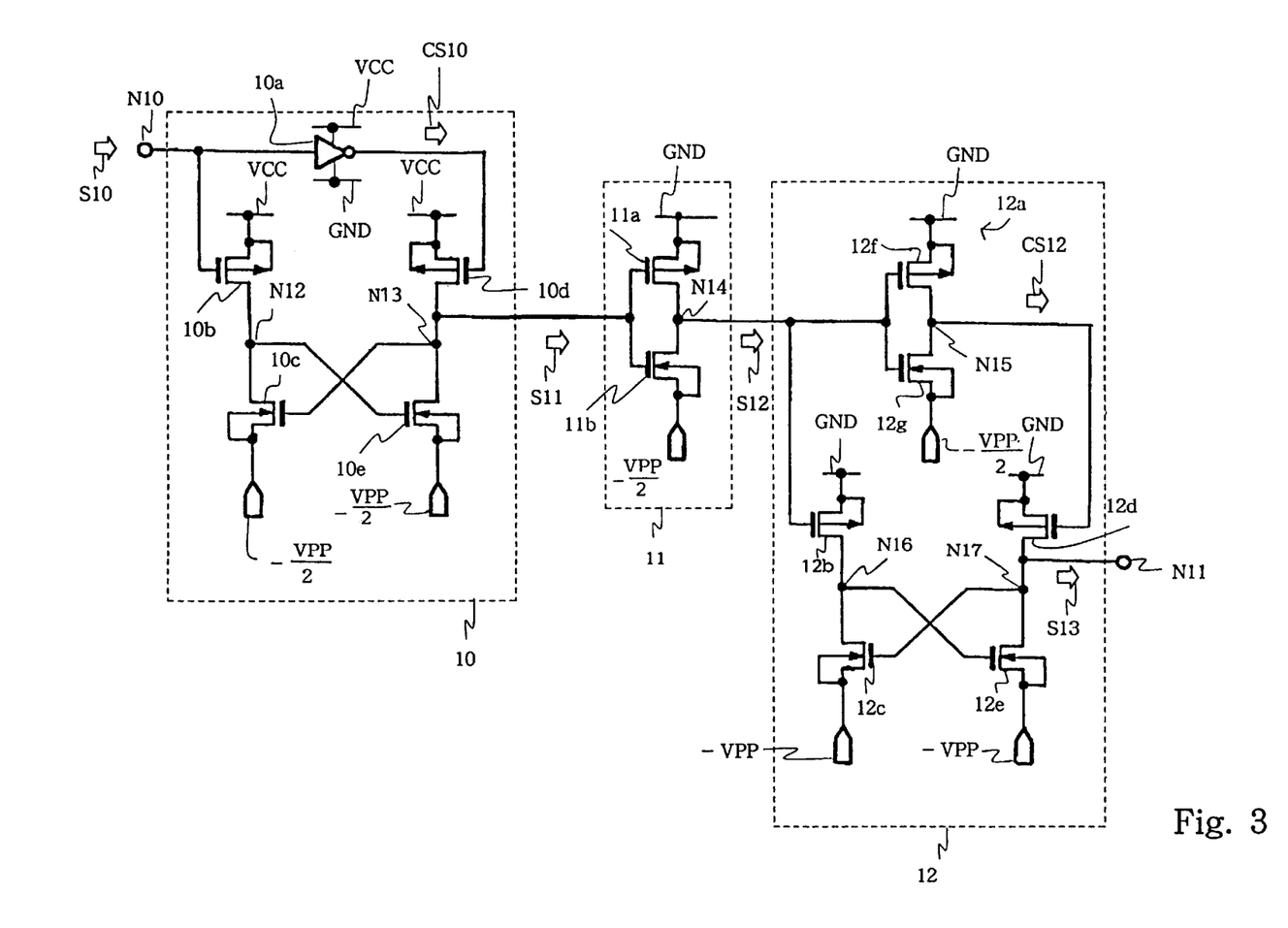
FIG. 3 is a circuit diagram showing the circuit configuration of a level shift circuit according to the present invention.

Referring to FIG. 3 of the drawings, a level shift circuit embodying the present invention comprises plural level shift stages 10, 11 and 12 connected in series between an input node N10 and an output node N11. The plural level shift stages 10/11/12 stepwise change the voltage range from the combination of a positive power voltage Vcc and a ground level GND to the combination of the ground level GND and a negative voltage −Vpp. The positive power voltage Vcc is 5 volts, and the negative voltage −Vpp is −12 volts. In this instance, the first limit voltage and the second limit voltage are the ground level GND and the negative level −Vpp, respectively, and the third limit voltage and the fourth limit voltage are the positive power voltage Vcc and the ground voltage GND, respectively. Thus, the fourth limit voltage, i.e., the ground voltage GND is closer to the first limit voltage, i.e., the ground voltage than the third limit voltage, i.e., the power voltage Vcc.

The level shift stage 10 comprises an inverter 10a connected to the input node N10, a series combination of a p-channel enhancement type field effect transistor 10b and an n-channel enhancement type field effect transistor 10c and another series combination of a p-channel enhancement type field effect transistor 10d and an n-channel enhancement type field effect transistor 10e arranged in parallel to the series combination. The two series combination form a flip flop circuit. The inverter 10a is powered with the positive power voltage Vcc and the ground level GND. The series combination of the p-channel enhancement type field effect transistor 10b and the n-channel enhancement type field effect transistor 10c is connected between a positive power supply line VCC and a negative voltage line −VPP/2, and the input node N10 and the output node of the inverter 10a are connected to the gate electrode of the p-channel enhancement type field effect transistor 10b and the gate electrode of the other p-channel enhancement type field effect transistor 10d, respectively. The negative voltage line −Vpp/2 is regulated to a negative voltage −Vpp/2, and the negative voltage −VPP/2 is a half of the negative voltage −Vpp with respect to the ground level GND. For this reason, the negative voltage −Vpp/2 is −6 volts. The common drain nodes N12/N13 are connected to the gate electrode of the n-channel enhancement type field effect transistor 10e and the gate electrode of the n-channel enhancement type field effect transistor 10c, respectively. The common drain node N13 serves as an output node of the level shift stage 10, and is connected to the level shift stage 11.

The level shift stage 10 behaves as follows. An input signal S10 is supplied to the input node N10, and is changed between the positive power voltage level Vcc and the ground level GND (see FIG. 4). Assuming now that the input signal S10 is changed from the ground level GND to the positive power voltage Vcc, the inverter 10a inverts the potential level of the input signal S10 so as to produce the complementary input signal CS10 of the ground level GND. The input signal S10 and the complementary input signal CS10 are supplied to the gate electrode of the p-channel enhancement type field effect transistor 10b and the gate electrode of the p-channel enhancement type field effect transistor 10d. The input signal S10 causes the p-channel enhancement type field effect transistor 10b to turn off, and the complementary input signal CS10 causes the other p-channel enhancement type field effect transistor 10d to turn on. The common drain node N12 is isolated from the positive power voltage line VCC, and the other common drain node N13 is electrically connected to the positive power supply line VCC. Then, the positive power voltage Vcc at the common drain node N13 causes the n-channel enhancement type field effect transistor 10c to turn on, and the negative voltage −VPP/2 is supplied to the other common drain node N12. The negative voltage −VPP/2 at the common drain node N12 causes the other n-channel enhancement type field effect transistor 10e to turn off. Thus, the level shift stage 10 changes the potential level at the common drain node N13 to the positive power voltage level Vcc, and supplies an intermediate signal S11 of the positive power voltage level Vcc to the next level shift stage 11.

On the other hand, when the input signal S10 is changed to the ground level GND, the inverter 10a changes the complementary input signal CS10 to the positive power voltage Vcc, and the input signal S10 and the complementary input signal CS10 are supplied to the gate electrode of the p-channel enhancement type field effect transistor 10b and the gate electrode of the p-channel enhancement type field effect transistor 10d, respectively. The p-channel enhancement type field effect transistor 10d turns off, and the other p-channel enhancement type field effect transistor 10b turns on. The positive power voltage Vcc is supplied to the common drain node N12, and the other common drain node N13 is isolated from the positive power supply line VCC. The positive power voltage Vcc at the common drain node N12 causes the n-channel enhancement type field effect transistor 10e to turn on, and the negative voltage −Vpp/2 is supplied to the common drain node N13. The negative voltage −Vpp/2 causes the other n-channel enhancement type field effect transistor 10c to turn off, and the intermediate signal S11 is fixed to the negative voltage −Vpp/2. Thus, the intermediate signal S11 is changed between the positive power voltage Vcc and the negative voltage −Vpp/2 (see FIG. 4).

When one of the n-channel enhancement type field effect transistors 10c and 10e is turned off, the positive power voltage Vcc and the negative voltage −Vpp/2 are applied to the drain node and the gate electrode thereof, and the potential difference between the drain node and the gate electrode is decreased to 11 volts. Thus, the n-channel enhancement type field effect transistors 10c/10e are relieved from the large potential difference.

The level shift stage 11 includes a series combination of a p-channel enhancement type field effect transistor 11a and an n-channel enhancement type field effect transistor 11b connected between the ground line GND and the negative voltage line −VPP/2. The output node of the level shift stage 10 is connected to the gate electrode of the p-channel enhancement type field effect transistor 11a and the gate electrode of the n-channel enhancement type field effect transistor 11b, and the common drain node N14 serves as an output node of the level shift stage 11. An intermediate signal S12 is produced at the output node of the level shift stage 11, and is changed between the ground level GND and the negative level −Vpp/2 (see FIG. 4).

While the intermediate signal S11 is in the positive power voltage Vcc, the p-channel enhancement type field effect transistor 11a is turned off, and the n-channel enhancement type field effect transistor 11b is turned on. Therefore, the intermediate signal S12 is in the negative level −Vpp/2. When the intermediate signal S11 is changed to the negative level −Vpp/2, the p-channel enhancement type field effect transistor 11a turns on, and the n-channel enhancement type field effect transistor 11b turns off. Then, the intermediate signal S12 is changed to the negative level −Vpp/2. The maximum potential difference is applied between the drain node and the gate electrode of the n-channel enhancement type field effect transistor 11b, and is 11 volts, i.e. (Vcc−(−Vpp/2). Thus, the level shift stage 11 is relieved from the large potential difference of the prior art level shift circuit.

The level shift stage 12 includes an inverter 12a connected to the output node N14 of the level shift stage 11, a series combination of a p-channel enhancement type field effect transistor 12b and an n-channel enhancement type field effect transistor 12c and another series combination of a p-channel enhancement type field effect transistor 12d and an n-channel enhancement type field effect transistor 12e arranged in parallel to the series combination. The two series combination form a flip flop circuit.

The inverter 12a is implemented by a series combination of a p-channel enhancement type field effect transistor 12f and an n-channel enhancement type field effect transistor 12g, and the series combination is connected between the ground line GND and the negative voltage line −VPP/2. The intermediate signal S12 is applied to the gate electrode of the p-channel enhancement type field effect transistor 12f and the gate electrode of the n-channel enhancement type field effect transistor 12g, and the p-channel enhancement type field effect transistor 12f and the n-channel enhancement type field effect transistor 12g complimentarily turn on and off so as to produce a complementary intermediate signal CS12 at an output node N15 thereof.

The series combination of the p-channel enhancement type field effect transistor 12b and the n-channel enhancement type field effect transistor 12c is connected between the ground line GND and the negative voltage line VPP, and the output nodes N14/N15 are connected to the gate electrode of the p-channel enhancement type field effect transistor 12b and the gate electrode of the other p-channel enhancement type field effect transistor 12d, respectively. The common drain nodes N16/N17 are connected to the gate electrode of the n-channel enhancement type field effect transistor 12e and the gate electrode of the n-channel enhancement type field effect transistor 12c, respectively. The common drain node N17 serves as an output node of the level shift stage 12.

The level shift stage 12 behaves as follows. Assuming now that the intermediate signal S12 is changed from the negative voltage level −Vpp/2 to the ground level GND, the inverter 12a inverts the potential level of the intermediate signal S12, and the complementary input signal CS1 is changed to the negative level −VPP/2. The intermediate signal S12 and the complementary intermediate signal CS12 are supplied to the gate electrode of the p-channel enhancement type field effect transistor 12b and the gate electrode of the p-channel enhancement type field effect transistor 12d. The intermediate signal S12 causes the p-channel enhancement type field effect transistor 12b to turn off, and the complementary intermediate signal CS12 causes the other p-channel enhancement type field effect transistor 12d to turn on. The common drain node N16 is isolated from the ground line GND, and the other common drain node N17 is electrically connected to the ground line GND. Then, the ground voltage GND at the common drain node N17 causes the n-channel enhancement type field effect transistor 12c to turn on, and the negative voltage −VPP is supplied to the other common drain node N16. The negative voltage −VPP at the common drain node N16 causes the other n-channel enhancement type field effect transistor 12e to turn off. Thus, the level shift stage 12 changes the potential level at the common drain node N17 to the ground level GND, and supplies an output signal S13 of the ground level GND to the output node N1.

On the other hand, when the intermediate signal S12 is changed to the negative voltage −Vpp/2, the inverter 12a changes the complementary intermediate signal CS12 to the ground level GND, and the intermediate signal S12 and the complementary intermediate signal CS12 are supplied to the gate electrode of the p-channel enhancement type field effect transistor 12b and the gate electrode of the p-channel enhancement type field effect transistor 12d, respectively. The p-channel enhancement type field effect transistor 12d turns off, and the other p-channel enhancement type field effect transistor 12b turns on. The ground level GND is supplied to the common drain node N16, and the other common drain node N17 is isolated from the ground line GND. The ground level at the common drain node N16 causes the n-channel enhancement type field effect transistor 12e to turn on, and the negative voltage −Vpp is supplied to the common drain node N17. The negative voltage −Vpp causes the other n-channel enhancement type field effect transistor 12c to turn off, and the output signal S13 is fixed to the negative voltage −Vpp. Thus, the output signal S13 is changed between the ground level GND and the negative voltage −Vpp (see FIG. 4).

The potential difference between the ground level GND and the negative voltage −Vpp/2 is applied to the p-channel enhancement type field effect transistor 12f and the n-channel enhancement type field effect transistor 12g, and the large potential difference (Vcc+Vpp) is never applied to the p-channel enhancement type field effect transistor 12f and the n-channel enhancement type field effect transistor 12g. Even when the n-channel enhancement type field effect transistor 12c/12e is turned off, the ground level GND is applied to the drain node thereof, and the negative voltage −Vpp is applied to the gate electrode thereof. For this reason, the maximum potential difference is equal to Vpp. Thus, the large potential difference (Vcc+Vpp) is never applied to any one of the field effect transistor of the level shift circuit shown in FIG. 3.

Figure 4:
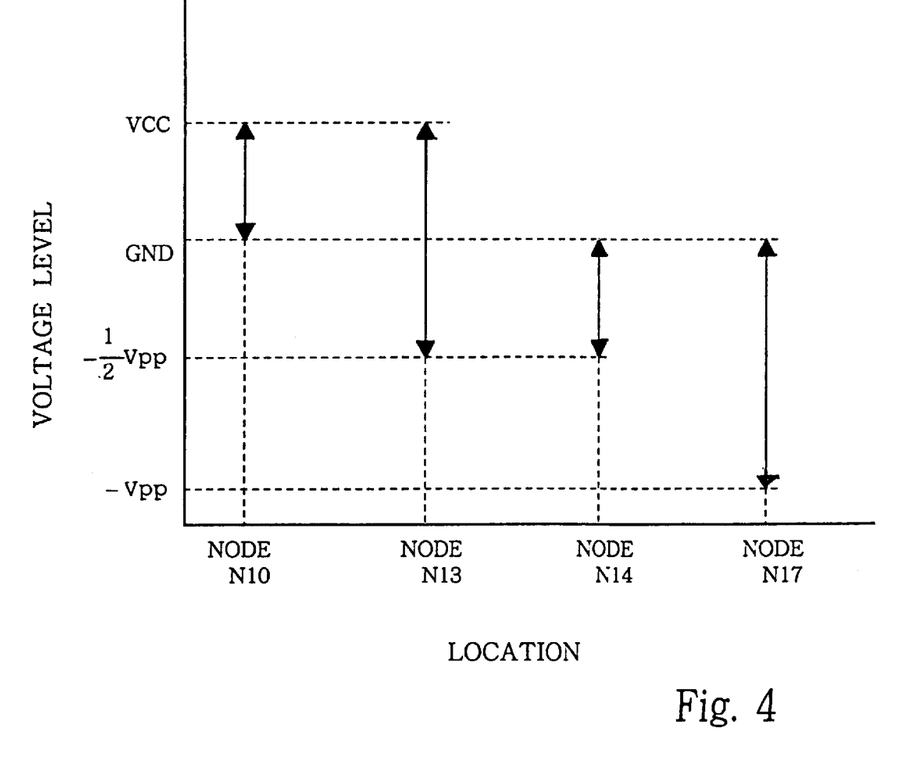
FIG. 4 is a view showing variation of potential range from an input signal to an output signal.

Thus, the voltage range is stepwise varied from the input signal N10 through the intermediate signals S11/S12 to the output signal S13. The voltage range is varied from the combination of Vcc/GND through the combination of Vcc/−Vpp/2 and the combination of GND/−Vpp/2 to the combination of GND/−Vpp. There is not the undesirable combination Vcc/−Vpp in the signal transfer, and the large potential difference (Vcc−(−Vpp)) is never applied between the source/drain node and the gate electrode of any component field effect transistor.

Figure 5:
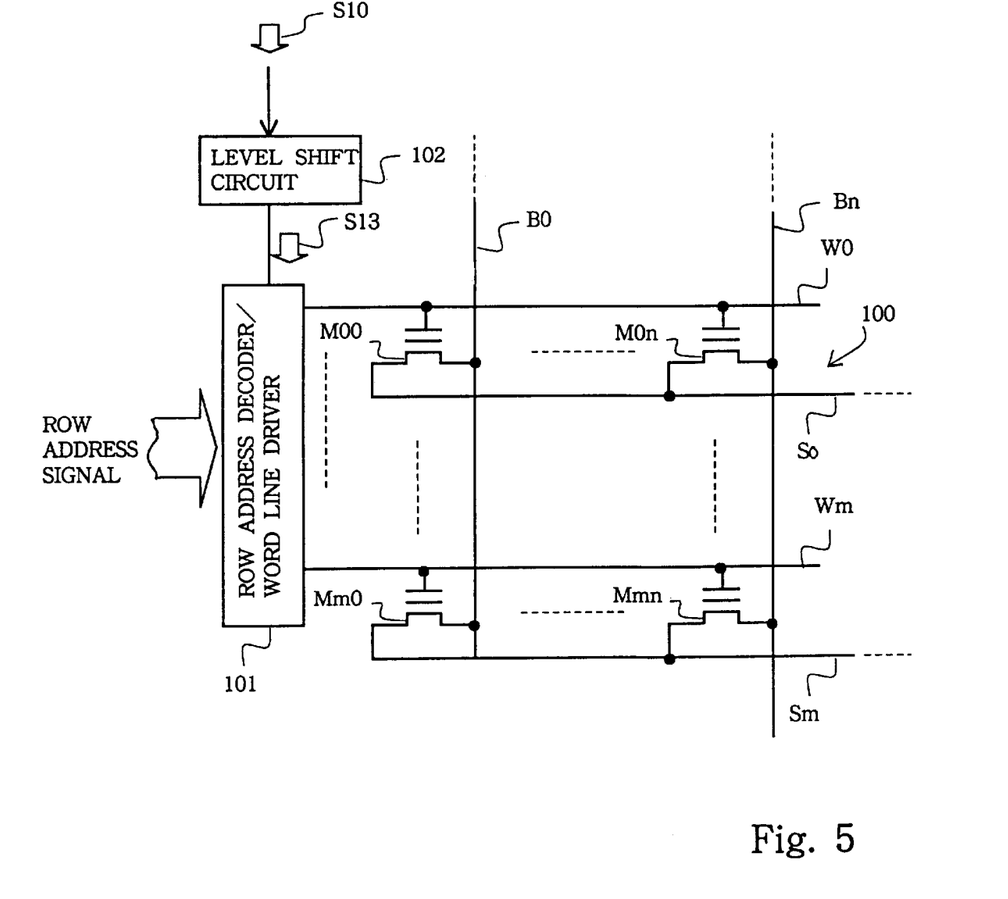
FIG. 5 is a block diagram showing the arrangement of an electrically erasable and programmable read only memory device.

The level shift circuit shown in FIG. 3 is available for generation of an erasing voltage in an electrically erasable and programmable read only memory device such as a flash write memory device. FIG. 5 illustrates the electrically erasable and programmable read only memory device. Plural floating gate type field effect transistors M00–M0n, . . . and Mm0–Mmn form a memory cell array 100. The structure of the floating gate type field effect transistors is well know to person skilled in the art, and no further description is made on the floating gate type field effect transistor. Word lines W0–Wm are associated with the rows of floating gate type field effect transistors, and are connected to the control gate electrodes of the associated floating gate type field effect transistors. Source lines S0–Sm are further associated with the rows of floating gate type field effect transistors, and are connected to source nodes of the associated floating gate type field effect transistors. Bit lines B0–Bn are respectively associated with the columns of floating gate type field effect transistors, and are connected to the drain nodes of the associated floating gate type field effect transistors.

A row address decoder/word line driver 101 is connected to the word lines W0–Wm, and is responsive to row address signals for selecting one of the word lines W0–Wm. The selection of bit lines B0–Bn is similar to a standard electrically erasable and programmable read only memory device, and no further description is incorporated hereinbelow.

The floating gate type field effect transistor increases the threshold in the presence of electrons accumulated in the floating gate electrode, and decreases it through evacuation of the electron from the floating gate electrode. When the electrically erasable and programmable read only memory device evacuates the electron from the floating gate electrode, the selected word line is driven to the negative voltage −Vpp, and the negative voltage −Vpp creates electric field for accelerating the electron from the floating gate electrodes toward the associated source line. For this reason, the level shift circuit 102 is connected to the row address decoder/word line driver 101. The level shift circuit 102 is similar to the level shift circuit shown in FIG. 3. The level shift circuit 102 produces an erase signal S13 from an erase control signal S10. The erase control signal S10 is changed between the positive power voltage Vcc and the ground voltage GND, and the erase signal S13 is changed between the ground voltage GND and the negative voltage −Vpp. The erase signal S13 on the selected word line causes the floating gate type field effect transistors to evacuate the electron from the floating gate electrodes.

Second Embodiment

Figure 6:
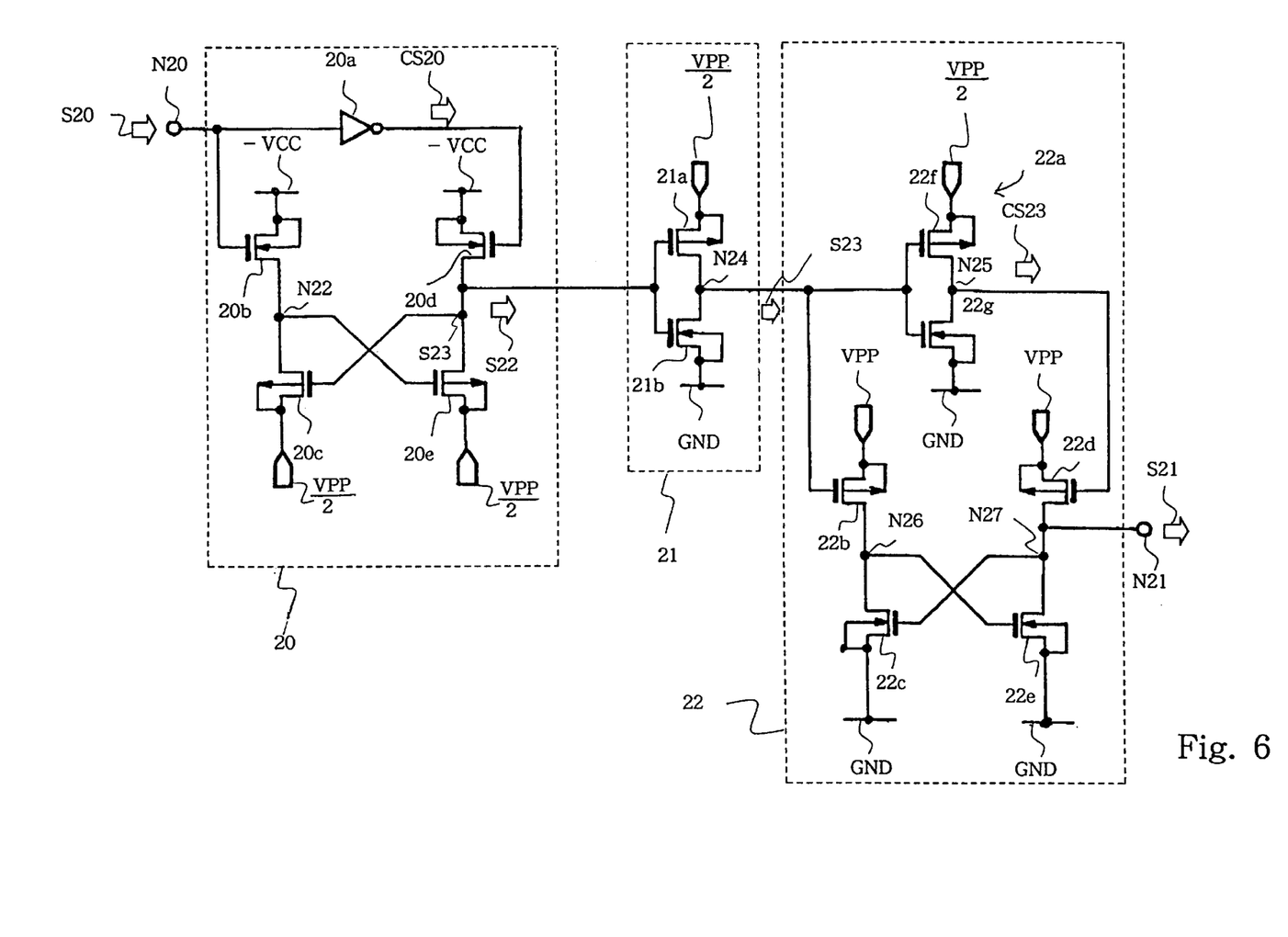
FIG. 6 is a circuit diagram showing the circuit configuration of another level shift circuit according to the present invention.

FIG. 6 illustrates another level shift circuit embodying the present invention. The level shift circuit shifts an input signal S20 at an input node N20 to an output signal S21 at an output node N21, and the input signal S20 and the output signal S21 are changed between a negative power voltage −Vcc and the ground level GND and between a positive voltage Vpp and the ground level GND. The level shift circuit comprises plural level shift stages 20/21/22, and the ground level GND, the positive voltage Vpp, a negative voltage Vcc and the ground voltage GND are corresponding to the first limit voltage, the second limit voltage, the third limit voltage and the fourth limit voltage, respectively.

The level shift stage 20 comprises an inverter 20a connected to the input node N20, a series combination of an n-channel enhancement type field effect transistor 20b and a p-channel enhancement type field effect transistor 20c and another series combination of an n-channel enhancement type field effect transistor 20d and a p-channel enhancement type field effect transistor 20e arranged in parallel to the series combination. The two series combinations form a flip flop circuit. The inverter 20a is powered with the negative power voltage −Vcc and the ground level GND, and produces the complementary signal CS20 of the input signal S20. The series combination of the n-channel enhancement type field effect transistor 20b and the p-channel enhancement type field effect transistor 20c is connected between a negative power supply line −VCC and a positive voltage line VPP/2, and the input node N20 and the output node of the inverter 20a are connected to the gate electrode of the n-channel enhancement type field effect transistor 20b and the gate electrode of the other n-channel enhancement type field effect transistor 20d, respectively. The positive voltage line VPP/2 is regulated to the positive voltage Vpp/2, and the positive voltage VPP/2 is a half of the positive voltage Vpp with respect to the ground level GND. If the positive voltage Vpp is +12 volts, the positive voltage Vpp/2 is 6 volts. The negative voltage −Vcc may be −5 volts. The common drain nodes N22/N23 are connected to the gate electrode of the p-channel enhancement type field effect transistor 20e and the gate electrode of the p-channel enhancement type field effect transistor 20c, respectively.

The common drain node N23 serves as an output node of the level shift stage 20, and is connected to the level shift stage 21. The level shift stage 20 produces an intermediate signal S22 from the input signal S20, and the intermediate signal S22 is changed between the negative voltage −Vcc and the positive voltage Vpp/2 (see FIG. 7).

The level shift stage 21 includes a series combination of a p-channel enhancement type field effect transistor 21a and an n-channel enhancement type field effect transistor 21b connected between the positive voltage line VPP/2 and the ground line GND. The output node of the level shift stage 20 is connected to the gate electrode of the p-channel enhancement type field effect transistor 21a and the gate electrode of the n-channel enhancement type field effect transistor 21b, and the common drain node N24 serves as an output node of the level shift stage 21. An intermediate signal S23 is produced at the output node N24 of the level shift stage 21, and is changed between the ground level GND and the positive level Vpp/2 (see FIG. 6).

The level shift stage 22 includes an inverter 22a connected to the output node N24 of the level shift stage 21, a series combination of a p-channel enhancement type field effect transistor 22b and an n-channel enhancement type field effect transistor 22c and another series combination of a p-channel enhancement type field effect transistor 22d and an n-channel enhancement type field effect transistor 22e arranged in parallel to the series combination. The two series combinations form a flip flop circuit.

The inverter 22a is implemented by a series combination of a p-channel enhancement type field effect transistor 22f and an n-channel enhancement type field effect transistor 22g, and the series combination is connected between the positive voltage line VPP/2 and the ground line GND. The intermediate signal S23 is applied to the gate electrode of the p-channel enhancement type field effect transistor 22f and the gate electrode of the n-channel enhancement type field effect transistor 22g, and the p-channel enhancement type field effect transistor 22f and the n-channel enhancement type field effect transistor 22g complementarily turn on and off so as to produce a complementary intermediate signal CS23 at an output node N25 thereof.

Figure 7:
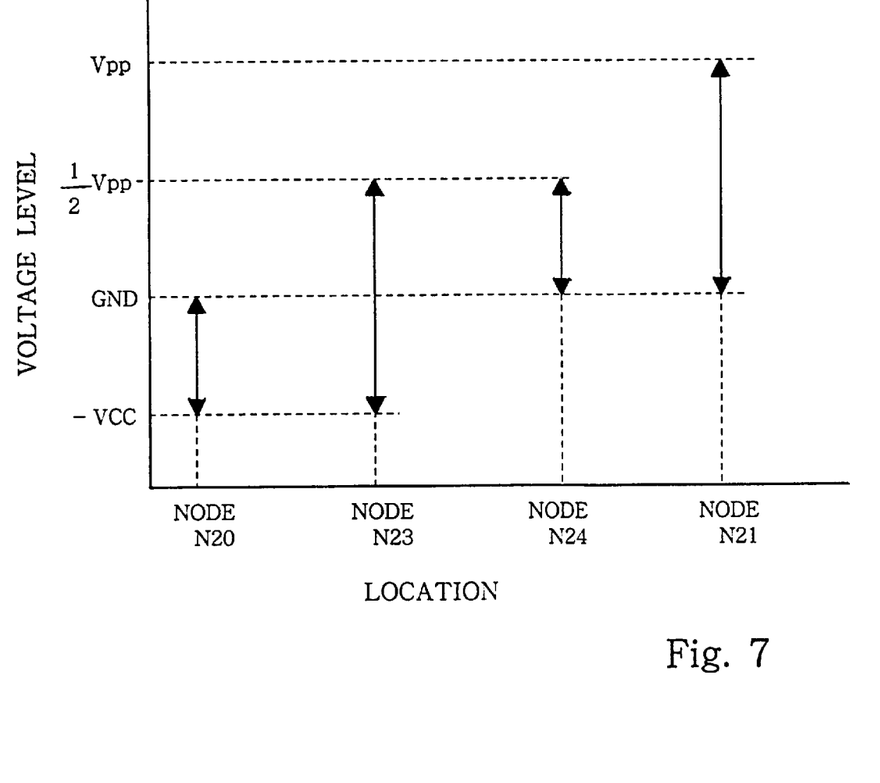
FIG. 7 is a view showing variation of potential range from an input signal to an output signal.

The series combination of the p-channel enhancement type field effect transistor 22b and the n-channel enhancement type field effect transistor 22c is connected between the positive voltage line VPP and the ground line GND, and the output nodes N24/N25 are connected to the gate electrode of the p-channel enhancement type field effect transistor 22b and the gate electrode of the other p-channel enhancement type field effect transistor 22d, respectively. The common drain nodes N26/N27 are connected to the gate electrode of the n-channel enhancement type field effect transistor 22e and the gate electrode of the n-channel enhancement type field effect transistor 22c, respectively. The common drain node N27 serves as an output node of the level shift stage 22. The level shift stage 22 produces the output signal S21 from the intermediate signal S23 as shown in FIG. 7.

The field effect transistors 20b–20e, 21a–21b and 22b–22g merely apply a potential difference less in absolute value than the potential difference (Vpp−(−Vcc)), and are hardly damaged. The intermediate voltage is not limited to Vpp/2 in so far as it remains between the negative voltage −Vcc and the positive voltage Vpp/2.

As will be appreciated from the foregoing description, the voltage range of the input signal is stepwise changed to the other voltage range of the output signal, and the large potential difference between the highest positive voltage and the lowest negative voltage is never applied to the component field effect transistors. For this reason, even if the component field effect transistors are scaled down, they are never damaged.

Although particular embodiments of the present invention have been shown and described, it will be apparent to those skilled in the art that various changes and modifications may be made without departing from the spirit and scope of the present invention.

For example, a level shift circuit may have more than three level shift stages. In this instance, each level shift stage produces an intermediate signal changed in a voltage range defined by two different voltages except for the combination of the highest voltage and the lowest voltage.

In the above described embodiments, the negative voltage −Vpp/2 is used for an intermediate voltage between the positive power voltage Vcc and the negative voltage −Vpp. However, the intermediate voltage is not limited to the negative voltage −Vpp/2. Another level shift circuit may use an intermediate voltage between the positive voltage Vcc and the negative voltage −Vpp.

What is claimed is:

1. A level shift circuit comprising:

a plurality of level shift stages connected in series between an input node and an output node for producing an output signal from an input signal, in which said output signal changes between a first limit level voltage and a second limit level voltage and said input signal changes between a third limit level voltage smaller in absolute value than and opposite in polarity to said second limit level voltage and a fourth limit level voltage, wherein said plurality of level shift stages includes:
a first level shift stage producing an intermediate signal changeable between two different voltages comprising one of said third or fourth limit level voltage and a fifth limit level voltage smaller in absolute value than and identical in polarity with said second limit level voltage; and
a second level shift stage producing said output voltage from said intermediate signal.

2. The level shift circuit as set forth in claim 1, wherein said first level shift stage changes said intermediate signal between said third limit level voltage and said fifth limit level voltage.

3. The level shift circuit as set forth in claim 2, wherein said plurality of level shift stage further includes a third level shift stage connected between said first level shift stage and said second level shift stage and producing another intermediate signal changeable between said fourth limit level voltage and said fifth limit level voltage, and said second level shift stage produces said output signal from said another intermediate voltage.

4. The level shift circuit as set forth in claim 1, wherein said second limit level voltage and said third limit level voltage have a negative value and a positive value, respectively.

5. The level shift circuit as set forth in claim 1, wherein said second limit level voltage and said third limit level voltage have a positive value and a negative value, respectively.

* * * * *